United States Patent
Kim

(10) Patent No.: US 8,405,110 B2
(45) Date of Patent: Mar. 26, 2013

(54) LIGHT EMITTING DEVICE PACKAGE INCLUDING A CURRENT REGULATOR AND DIFFERENT INCLINATION ANGLES

(75) Inventor: TaeJin Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/109,368

(22) Filed: May 17, 2011

(65) Prior Publication Data

US 2011/0241030 A1    Oct. 6, 2011

(30) Foreign Application Priority Data

May 17, 2010   (KR) ................. 10-2010-0046104

(51) Int. Cl.
*H01L 33/00* (2010.01)
(52) U.S. Cl. ............. 257/98; 257/E33.067; 438/124
(58) Field of Classification Search .............. 257/98, 257/99, E33.067, E33.072; 438/106, 124
See application file for complete search history.

(56) References Cited

U.S. PATENT DOCUMENTS

| | | | | |
|---|---|---|---|---|
| 6,331,670 | B2* | 12/2001 | Takehara et al. | 136/244 |
| 7,264,378 | B2* | 9/2007 | Loh | 362/294 |
| 7,593,236 | B2* | 9/2009 | Chikugawa | 361/760 |
| 7,679,101 | B2* | 3/2010 | Ota et al. | 257/100 |
| 7,939,919 | B2* | 5/2011 | Hsieh | 257/675 |
| 7,964,886 | B2* | 6/2011 | Fujita et al. | 257/98 |
| 2002/0080622 | A1* | 6/2002 | Pashley et al. | 362/555 |
| 2003/0168720 | A1 | 9/2003 | Kamada | |
| 2004/0256706 | A1 | 12/2004 | Nakashima | |
| 2005/0280017 | A1* | 12/2005 | Oshio et al. | 257/99 |
| 2006/0267040 | A1* | 11/2006 | Baek et al. | 257/99 |
| 2007/0075451 | A1 | 4/2007 | Winter et al. | |
| 2007/0114514 | A1* | 5/2007 | Ito | 257/13 |
| 2008/0037252 | A1* | 2/2008 | Nii et al. | 362/267 |
| 2008/0186712 | A1 | 8/2008 | Chen | |
| 2009/0267104 | A1* | 10/2009 | Hsu et al. | 257/99 |

FOREIGN PATENT DOCUMENTS

| | | |
|---|---|---|
| JP | 2010-062286 | 3/2010 |
| KR | 10-2008-0075026 | 8/2008 |
| KR | 10-2010-0037360 | 4/2010 |
| WO | WO 2007/077960 | 7/2007 |

OTHER PUBLICATIONS

European Search Report issued in EP Application No. 11166407.4 dated Apr. 12, 2012.
Korean Office Action issued in KR Application No. 10-2010-0046104 dated Jan. 23, 2013.

* cited by examiner

*Primary Examiner* — John C Ingham
(74) *Attorney, Agent, or Firm* — KED & Associates LLP

(57) ABSTRACT

A light emitting device package is provided which may prevent a Zener element mounted on an electrode from being positioned on an inclined plane of a cavity. The light emitting device package may include a light emitting device mounted on a first electrode, a Zener element mounted on a second electrode, and a body having cavity inclined planes that form a cavity on the first and second electrodes. The cavity inclined planes may include a first cavity inclined plane adjacent to the Zener element. The first cavity inclined plane may include an inclined plane forming a first inclination angle with respect to the second electrode and an interfacing plane forming a second inclination angle with respect to the second electrode, the second inclination angle being different from the first inclination angle.

19 Claims, 10 Drawing Sheets

525 526 524 523 522 521

535 536 534 533 532 531

US 8,405,110 B2

LIGHT EMITTING DEVICE PACKAGE INCLUDING A CURRENT REGULATOR AND DIFFERENT INCLINATION ANGLES

CROSS-REFERENCE TO RELATED APPLICATION

This application claims the priority benefit of Korean Patent Application No. 10-2010-0046104, filed on in Korea May 17, 2010, the disclosure of which is incorporated herein by reference.

BACKGROUND OF THE EMBODIMENT

1. Field

This relates to a light emitting device package.

2. Background

A light emitting device may include, for example, a light emitting diode (LED) including a semiconductor device which converts electrical energy into light.

Such a light emitting diode may use a chip type semiconductor instead of heat or electric discharge to generate light.

Such an LED, including a chip having a relatively small size, and a package body may be susceptible to electrostatic damage (ESD). A Zener element, such as a Zener diode may be used to reduce ESD.

BRIEF DESCRIPTION OF THE DRAWINGS

The embodiments will be described in detail with reference to the following drawings in which like reference numerals refer to like elements wherein.

DETAILED DESCRIPTION

Figure 1:
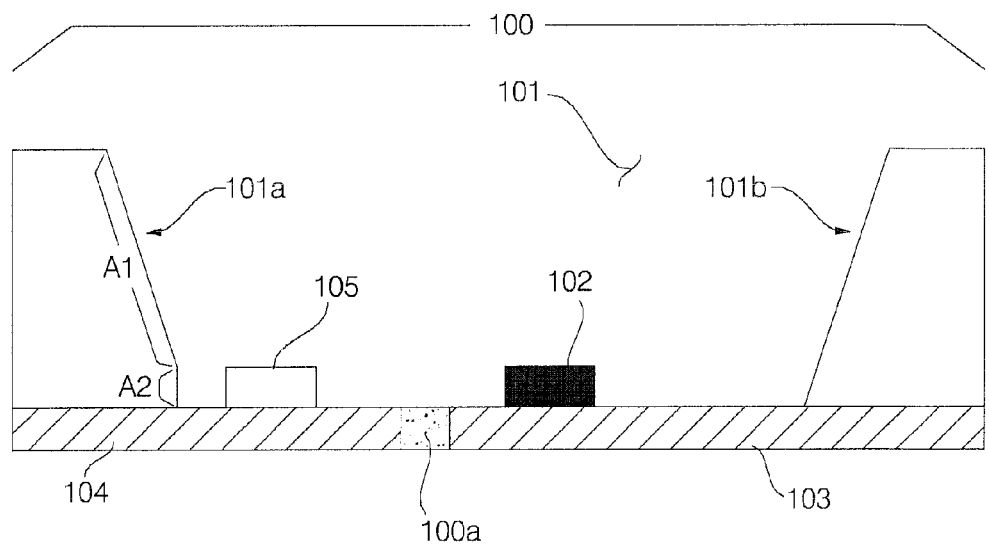
FIG. 1 is a cross-sectional view of a light emitting device package in accordance with an embodiment as broadly described herein.

Reference will now be made in detail to exemplary embodiments, examples of which are illustrated in the accompanying drawings. Wherever possible, the same reference numbers will be used throughout the drawings to refer to the same or like parts.

It may be understood that when an device such as a layer (film), a region, a pad or a pattern is referred to as being "on" or "under" another device, it may be directly or indirectly on or under the other device. Further, the "on" or "under" positioning of each layer will be described based on illustration in the drawings.

In the drawings, the thicknesses or sizes of respective layers may be exaggerated, omitted, or schematically illustrated for convenience and clarity of description. Therefore, the sizes of respective devices shown in the drawings do not necessarily denote the actual sizes thereof.

Further, angles and directions referred to during description of a structure of a light emitting device array may be described with reference to illustration in the drawings. In the description of the structure of the light emitting device array, if reference points with respect to the angles and positional relations are not clearly stated, the related drawings may be relied upon.

With reference to FIG. 1, a light emitting device package as embodied and broadly described herein may include a light emitting device 102, a Zener element 105, a first electrode 103 on which the light emitting device 102 is mounted, a second electrode 104 which is separated from the first electrode 103 and on which the Zener element 105 is mounted, and a body 100 including first and second cavity inclined planes 101a and 101b that define sides of a cavity 101 on the first and second electrodes 103 and 104.

The body 100 may be made of, for example, a resin material such as, for example, polyphthalamide (PPA), silicon (Si), aluminum (Al), aluminum nitride (AlN) or aluminum oxide (AlOx), a liquid crystal polymer such as, for example, photo sensitive glass (PSG), polyamide 9T (PA9T), syndiotactic polystyrene (SPS), a metal, sapphire ($Al_2O_3$), beryllium oxide (BeO), a printed circuit board (PCB), a conductive ceramic, or various combination(s) thereof.

The body 100 may be formed by an injection molding or etching process, or other process as appropriate. The body 100 may include an insulator 100a to provide for electrical insulation between the first and second electrodes 103 and 104. The body 100 may have various shapes including, for example, a rectangle, a circle, a polygon and other such shapes, depending on a particular application. Surfaces of the body 100 except portions thereof contacting the first electrode 103 and the second electrode 104 and a portion thereof at the cavity 101 may be covered with a synthetic resin material or coated with an insulating film.

An irradiation angle of light emitted from the light emitting device 102 to the outside may increase or decrease according to an angle of the first and second cavity inclined planes 101a and 101b with respect to the first electrode 103 and the second electrode 104.

For example, the irradiation angle of the light emitted from the light emitting device 102 to the outside may increase as the angle of the first and second cavity inclined planes 101a and 101b with respect to the first electrode 103 and the second electrode 104 approaches a right angle. The irradiation angle of the light emitted from the light emitting device 102 to the outside may decrease as the angle of the first and second cavity inclined planes 101a and 101b with respect to the first electrode 103 and the second electrode 104 progresses away from a right angle. As the irradiation angle decreases, convergence of the light emitted from the light emitting device 102 to the outside may increase. Similarly, as the irradiation angle of the light increases, convergence of the light emitted from the light emitting device 102 to the outside may decrease.

The first electrode 103 and the second electrode 104 may apply positive (+) voltage and negative (−) voltage to the light emitting device 102. Thus, the first and second electrodes 103 and 104 may be separated from each other so as to be electrically insulated from each other. When the first electrode 103 and the second electrode 104 are separated from each other, external foreign substances such, for example, as moisture and dust, may enter such a separation region. In order to prevent such infiltration of external foreign substances into the inside of the body 100, the cavity 101 may be filled with a resin material. The resin material may be, for example silicon, epoxy and other materials as appropriate.

The resin material may include a phosphor. The phosphor may be, for example, a blue light emitting phosphor, blue-green light emitting phosphor, green light emitting phosphor, yellow-green light emitting phosphor, yellow light emitting phosphor, yellow-red light emitting phosphor, orange light emitting phosphor or red light emitting phosphor, depending on wavelengths of light emitted from the light emitting device 102.

Such a resin material, including a phosphor selected based on the wavelength of the light emitted from the light emitting device 102, may fill the cavity 101, or alternatively, a plurality of resin material layers may be stacked in the cavity 101.

If a plurality of resin material layers is stacked in the cavity 101, a first resin material layer and a second resin material layer up to an nth resin material layer may sequentially stacked in the cavity 101. In certain embodiments, at least one layer of the plural resin material layers may include a phosphor or a diffusing agent, or may exclude a phosphor or a diffusing agent as dictated by a particular application. In certain embodiments, the resin material may include one phosphor, or two or more phosphors.

The phosphor included with the resin material may be a double phosphor so that white light is ultimately generated when the wavelength of the light emitted from the light emitting device 102 corresponds to green or red. For example, when the light emitting device 102 emits light having a wavelength corresponding to green, the resin material may include phosphors exciting red and blue, so that white light may be generated from the green light emitted by the light emitting device 102.

For example, the resin material applied directly to the light emitting device 102 may include a layer including a double phosphor, and then a layer made of a transparent material stacked on the double phosphor layer. Alternatively, the resin material may include a layer made of a transparent material provided on the light emitting device 102, and then a layer including a double phosphor stacked on the transparent layer.

The light emitting device 102 may be one of, for example, a blue light emitting device to emit blue light, a red light emitting device to emit red light, a green light emitting device to emit green light, or an ultraviolet (UV) light emitting device to emit UV light.

The light emitting device 102 may be a horizontal type light emitting device in which the light emitting device 102 is electrically connected with the first electrode 103 and the second electrode 104 by metal wires. Alternatively, the light emitting device 102 may be a vertical type light emitting device in which the light emitting device 102 is wire-bonded to the second electrode 104 and is not wire-bonded to the first electrode 103. Further, in such a vertical type light emitting device, the lower end of the light emitting device 102, i.e., a region of the light emitting device 102 contacting the first electrode 103, may be electrically connected to the first electrode 103, and thus the light emitting device 102 is not necessarily wire-bonded to the first electrode 103.

The first and second cavity inclined planes 101a and 101b may be inclined with respect to the surfaces of the first electrode 103 and the second electrode 104 to define the cavity 101 as a depression in the body 100. The first cavity inclined plane 101a formed on the second electrode 104 may include an interfacing plane A2 contacting the second electrode 104 and an inclined plane A1. The interfacing plane A2 may prevent the Zener element 105, which controls the ESD applied to the light emitting device 102, from moving or being mis-aligned, and/or may prevent the Zener element 105 from warping. Further, the interfacing plane A2 may change an irradiation angle of light emitted from the light emitting device 102 based an angle between the interfacing plane A2 and the surface of the second electrode 104.

For clarity and ease of discussion, the angle between the interfacing plane A2 and the second electrode 104 will be considered to be the angle formed between the respective surfaces thereof that define the corresponding interior corner of the cavity 101. The irradiation angle of the light emitted from the light emitting device 102 via the cavity 101 to the outside may increase and convergence of the emitted light may decrease as the angle formed between the interfacing plane A2 and the surface of the second electrode 104 approaches a right angle.

On the other hand, the irradiation angle of the light emitted from the light emitting device 102 may decrease and convergence of the emitted light may increase as the angle formed between the interfacing plane A2 and the surface of the second electrode 104 progresses away from a right angle and becomes obtuse.

In certain embodiments, the height of the interfacing plane A2 from the surface of the second electrode 104 may be substantially equal to the height of the Zener element 105 from the surface of the second electrode 104. In alternative embodiments, the height of the interfacing plane A2 may be minimized so that a path of the light emitted from the light emitting device 102 is not disturbed.

However, it is understood that the height of the interfacing plane A2 may be equal to the height of the Zener element 105, or may be lower or higher than the height of the Zener element 105, and may be established as necessary based on the relative heights of other related components, angular orientation of the respective cavity inclined plane/interfacing plane, light emission direction and amount, and other such factors.

In certain embodiments, the height of the Zener element 105 may be approximately 50 μm~300 μm, and the height of the interfacing plane A2 may be determined so as to correspond thereto.

Hereinafter, a method of determining a height of the interfacing plane A2 compared to a height of the Zener element 105 based on the surface of the second electrode 104 of the light emitting device package shown in FIG. 1 will be described with reference to FIGS. 2 and 3.

Figure 2:
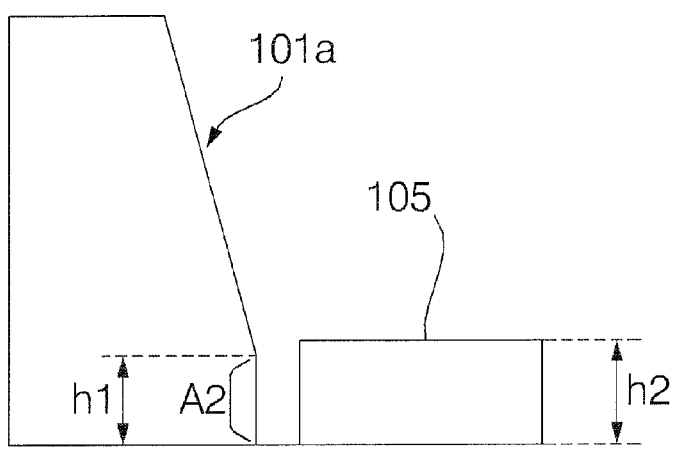
FIGS. 2 and 3 illustrate heights of interfacing planes of the light emitting device package shown in FIG. 1.

As shown in FIG. 2, a height h1 of the interfacing plane A2 formed at one region of the first cavity inclined plane 101a may be lower than a height h2 of the Zener element 105. The interfacing plane A2 shown in FIG. 2 is substantially perpendicular to the second electrode 104 and thus positioning of the Zener element 106 on the second electrode 104 along this portion of the interfacing plane A2 may be difficult due to somewhat limited access to this portion of the surface of the second electrode 104. This lower height h1 of the interfacing plane A2 may minimize influence of the interfacing plane A2 on side light emitted from the light emitting device 102.

Figure 3:
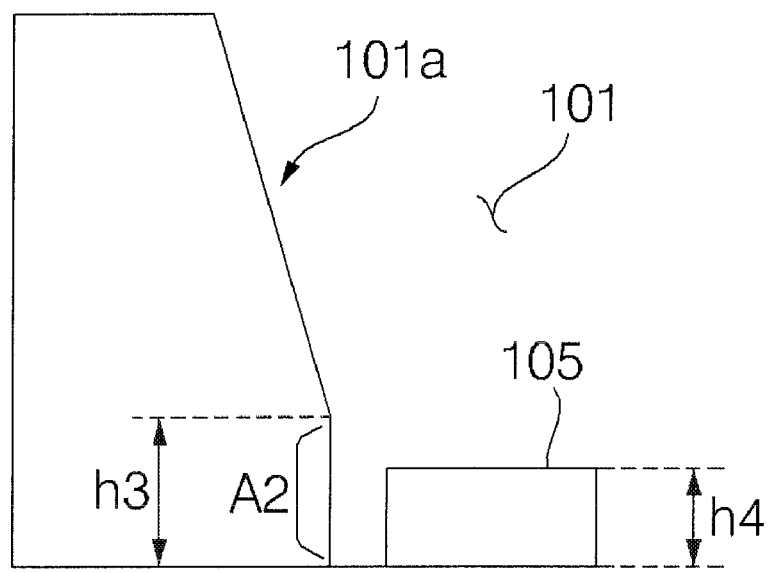

Next, with reference to FIG. 3, a height h3 of the interfacing plane A2 formed at one region of the first cavity inclined plane 101a may be higher than a height h4 of the Zener element 105. If the irradiation angle of light emitted from the light emitting device 102 is relatively small, i.e., if relatively little of the side light emitted from the light emitting device 102 proceeds to the interfacing plane A2, even though the height h3 of the interfacing plane A2 is higher than the height h4 of the Zener element 105, the interfacing plane A2 may not influence the irradiation angle of the light emitted from the light emitting device 102. As the height h3 of the interfacing plane A2 increases, positioning/mounting of the Zener element 105 on the second electrode 104 in proximity of the interfacing plane A2 may become more difficult due to a more restrictive access area. However, movement of the Zener element 105 along the interfacing plane A2 may also become more difficult, thus reducing a failure rate of the light emitting device package due to the more stable positioning of the Zener element 105.

Figure 4:
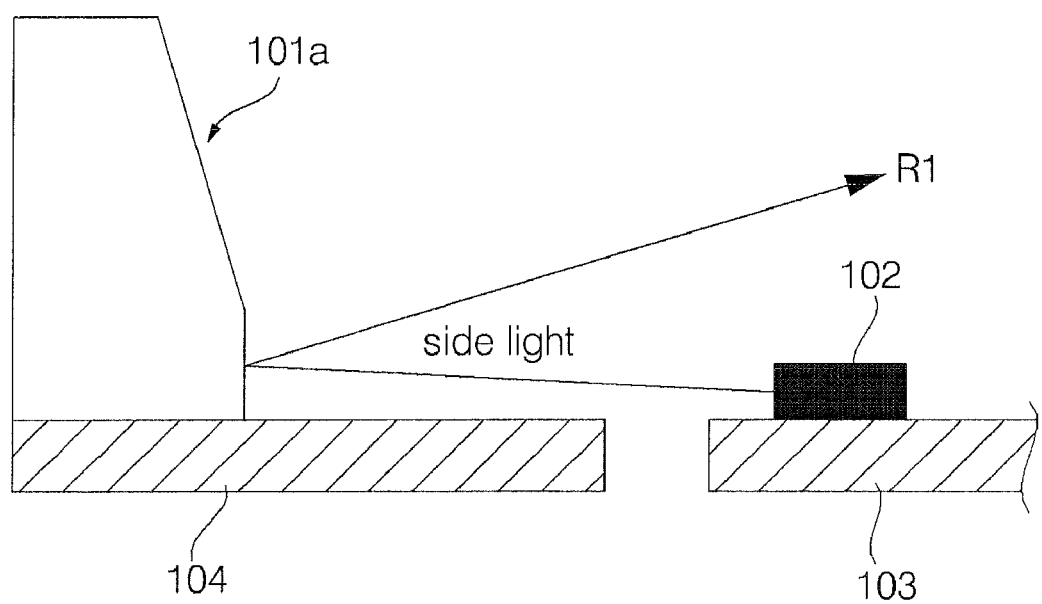
FIG. 4 illustrates a relationship between heights of interfacing planes and irradiation angles of the light emitting device package shown in FIG. 1.

For example, as shown in FIG. 4, the interfacing plane A2 reflects side light emitted from the light emitting device 102 in a direction R1. When the interfacing plane A2 is formed substantially perpendicular to the second electrode 104, the interfacing plane A2 reflects the light emitted from the light emitting device 102 in an undesired direction, i.e., the direction R1, and thus decreases convergence of the light emitted from the light emitting device 102.

To avoid this adverse impact on convergence when the interfacing plane A2 is formed perpendicular to the second electrode 104, the height of the interfacing plane A2 may be decreased/minimized in this situation.

However, if an amount of side light emitted from the light emitting device 102 is relatively small or the irradiation angle of light emitted from the light emitting device 102 is relatively small, the height of the interfacing plane A2 may be increased without having as much of an adverse impact on convergence.

Figure 5:
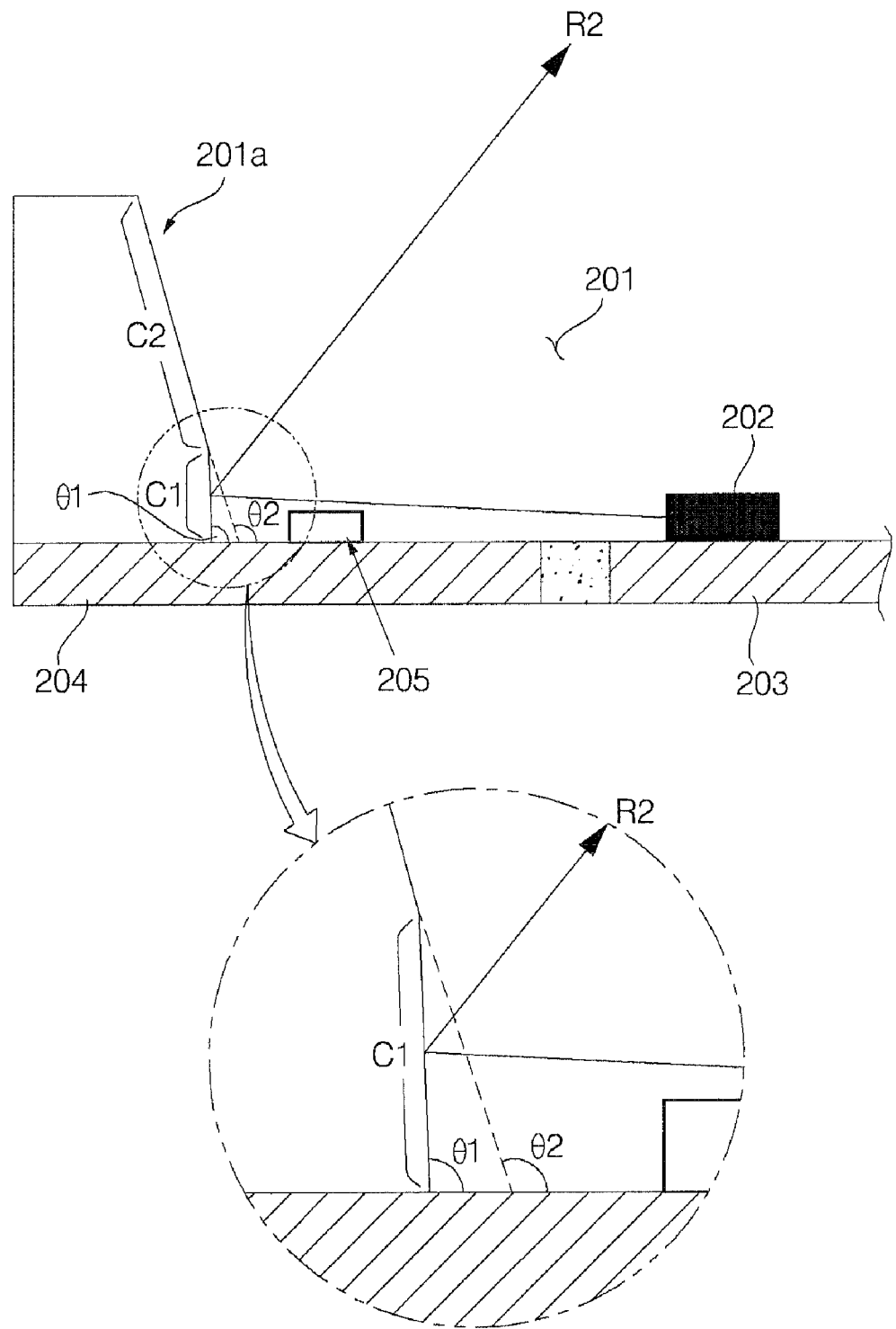
FIG. 5 is a conceptual view of a relationship between a structure of an interfacing plane and a reflection angle.

FIG. 5 is a conceptual view of a relationship between a structure of an interfacing plane and a reflection angle.

With reference to FIG. 5, a first cavity inclined plane 201a may include an inclined plane C2 that forms an angle θ2 with respect to a surface of a second electrode 204, and an interfacing plane C1 that forms an angle θ1 with respect to the surface of the second electrode 204.

The angle θ2 of the inclined plane C2 and the angle θ1 of the interfacing plane C1 satisfy the relationship of θ2>θ1 when an angle θ is measured at respective surfaces of the cavity inclined plane 201a and the second electrode 204 that meet to form a corner at the interior of the cavity 201. Therefore, location/mounting of a Zener element 205 on a surface of the second electrode 204 adjacent to the interfacing plane C1 having the angle θ1, which is steeper than the inclined plane C2 having the angle θ2, may be somewhat difficult. In FIG. 5, the angle θ1 of the interfacing plane C1 is an obtuse angle that is close to a right angle.

As the angle θ1 of the interfacing plane C1 approaches the right angle, side light emitted from a light emitting device 202 mounted on a first electrode 203 toward the interfacing plane C1 does not converge into central light but instead may diverge in a sideward direction of the central light. Therefore, if side light is not emitted from the light emitting device 202, the angle θ1 of the interfacing plane C1 may be a right angle with respect to the surface of the second electrode 205 without significantly impacting convergence. However, if side light is emitted from the light emitting device 202, the angle θ1 of the interfacing plane C1 may be set to an angle greater than 90 degrees, i.e., an obtuse angle.

In this example, the angle θ1 of the interfacing plane C1 is less than the angle θ2 of the inclined plane C2. If the angle θ1 of the interfacing plane C1 is greater than or equal to the angle θ2 of the inclined plane C2, the Zener element 205 positioned/mounted at both the interfacing plane C1 and the second electrode 204 may be damaged.

Figure 6:
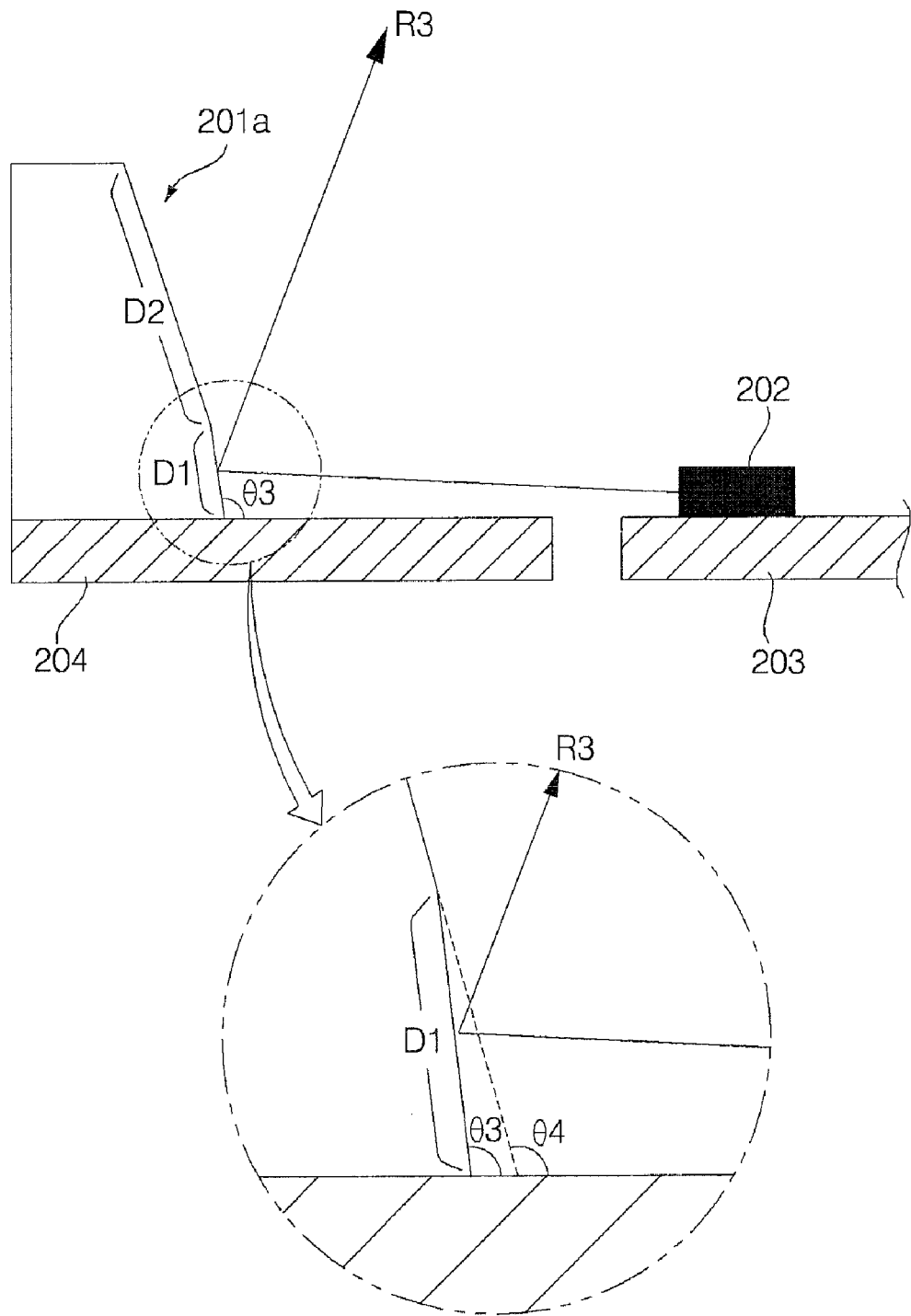
FIG. 6 is a cross-sectional view of an interfacing plane.
Figure 7:
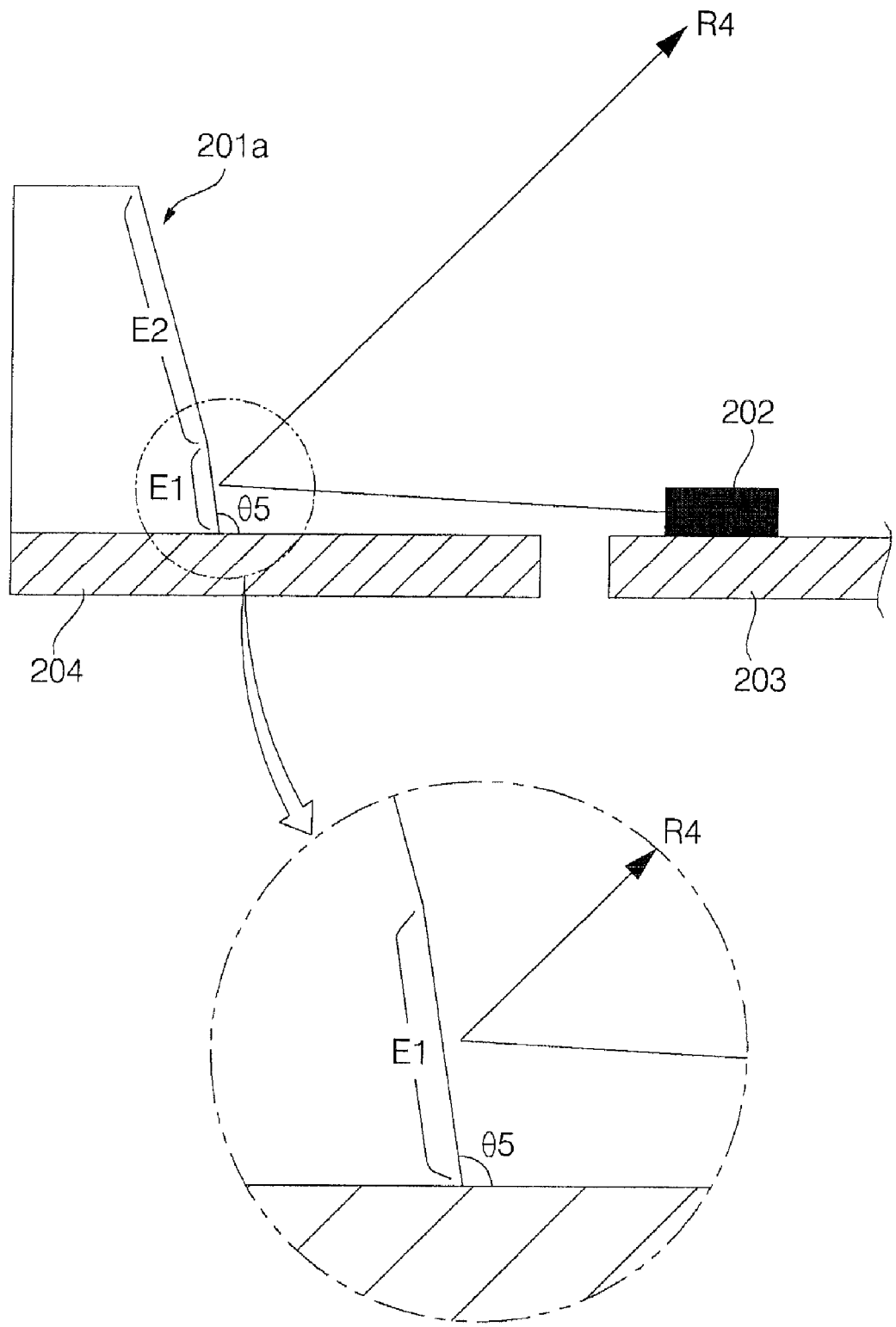
FIG. 7 is a cross-sectional view of another interfacing plane.

FIGS. 6 and 7 are cross-sectional views of interfacing planes. With reference to FIG. 6, the first cavity inclined plane 201a may include an inclined plane D2 and an interfacing plane D1. The interfacing plane D1 may form a gentle obtuse angle θ3 with the second electrode.

The interfacing plane D1 may reflect side light emitted from the light emitting device 202 mounted on the first electrode 203 in a direction R3, and may allow the reflected light to approach central light emitted from the light emitting device 202. The angle θ3 of the interfacing plane D1 shown in FIG. 6 with respect to the surface of the second electrode 204 is only slightly different from an angle θ4 of the inclined plane D2 with respect to the surface of the second electrode 204. In certain embodiments, the angle θ3 of the interfacing plane D1 may be a minimum angle that prevents the Zener element 205 from being inadvertently positioned on the inclined plane D1, rather than the second electrode 204, as it may provide a relatively large access area from the top of the cavity for mounting the Zener element 205 on the second electrode 204.

Therefore, this structure of the first cavity inclined plane 201a may reduce damage to the Zener element 205 while maximizing convergence of light emitted from the light emitting device 202. However, since the angle θ3 of the interfacing plane D1 is relatively gentle, it is unlikely that the Zener element 205 will be mounted at a region of the interfacing plane D1 due to a manufacturing process error. Therefore, the angle θ3 of the interfacing plane D1 may have a value in the range of, for example, 90 degrees to 150 degrees, and the angle θ3 of the interfacing plane D1 may be less than the angle θ4 of the inclined plane D2. For example, the angle θ4 of the inclined plane D2 may be 120 degrees to 150 degrees, or set as appropriate for a particular application.

Next, with reference to FIG. 7, the first cavity inclined plane 201a includes an inclined plane E2 and an interfacing plane E1. The interfacing plane E1 forms an obtuse angle θ5 that is close to a right angle. The interfacing plane E1 having the angle θ5 may reflect side light emitted from the light emitting device 202 mounted on the first electrode 203 in a direction R4, and may allow the reflected light to be separated from central light emitted from the light emitting device 202. This type of structure of the first cavity inclined plane 201a may significantly reduce potential for damage to the Zener element 205, while also decreasing convergence of light emitted from the light emitting device 202 but increasing diffusion of the light.

Figure 8:
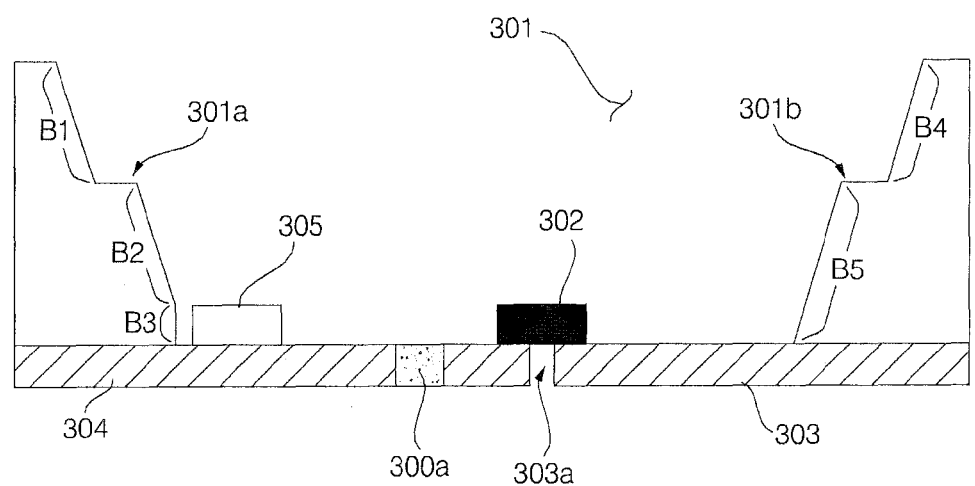
FIG. 8 is a cross-sectional view of a light emitting device package in accordance with another embodiment as broadly described herein.

FIG. 8 is a cross-sectional view of a light emitting device package in accordance with another embodiment as broadly described herein.

A detailed description of parts of the embodiment shown in FIG. 8 which are similar to or substantially the same as those in the embodiment shown in FIG. 1 will be omitted or be provided in brief.

A body of a light emitting device package in accordance with the embodiment shown in FIG. 8 may include a first cavity inclined plane 301a and a second cavity inclined plane 301b, each of which has a multistage structure with a stepped portion formed between adjacent stages.

The first cavity inclined plane 301a may include an interfacing plane B3 formed substantially perpendicular to the surface of a second electrode 304 such that a Zener element 305 may be properly positioned on the second electrode 304, and not inadvertently mounted on or shifted toward the inclined plane B3, a first inclined plane B2 extended from the interfacing plane B3, and a second inclined plane B1 provided adjacent to the first inclined plane B2. The stepped portion may be interposed between the first inclined plane B2 and the second inclined plane B1. Other arrangements, number of inclined plates and stepped portions may also be appropriate.

In certain embodiments, the first cavity inclined plane 301a may provide characteristics of a reflecting mirror. That is, when the first cavity inclined plane 301a extends upwards with the stepped portion located between the first inclined plane B2 and the second inclined plane B1, the overall length of the first cavity inclined plane 301a, including the stepped portion, increases, and thus convergence of light emitted from a light emitting device 302 may also be increased in a direction of strengthening central light emitted from the light emitting device 302 due to the reflecting mirror effect of the first cavity inclined plane 301a.

A heat dissipation hole 303a may be formed on a first electrode 303 of the light emitting device package shown in FIG. 8, at a position under the light emitting device 302 mounted on the first electrode 303, or other position as appropriate. The heat dissipation hole 303a may dissipate heat, generated by the light emitting device 302, to the outside through the lower end of the light emitting device 302, thereby improving heat dissipation characteristics of the light emitting device 302. The heat dissipation hole 303a may be formed throughout light emitting device packages described herein, in addition to the light emitting device package shown in FIG. 8. The heat dissipation hole 303a may be formed under the light emitting device 302.

The first electrode 303 and the second electrode 304 may apply positive (+) voltage and negative (−) voltage to the light emitting device 302, and may be separated from each other so as to be electrically insulated from each other. Dust, moisture and other external foreign substances may enter a separation region between the first electrode 303 and the second electrode 304. An insulating member 300a may be provided between the first electrode 303 and the second electrode 304 to provide electrical insulation therebetween and prevent external foreign substances from entering the light emitting device package. The insulating member 300a may be made of a resin material, such as, for example, silicon or epoxy or other material as appropriate.

As shown in FIG. 8, the second cavity inclined plane 301b may include a third inclined plane B4 and a fourth inclined plane B5. Since the Zener element 305 is not provided along the fourth inclined plane B5 in the embodiment shown in FIG. 8, a separate interfacing plane is not necessarily provided, as it is with the first cavity inclined plane 301a.

In this embodiment, the first cavity inclined plane 301a and the second cavity inclined plane 301b have different shapes. However, the first cavity inclined plane 301a and the second cavity inclined plane 301b may have the same shape, or other arrangements of components thereof as appropriate.

Figure 9:
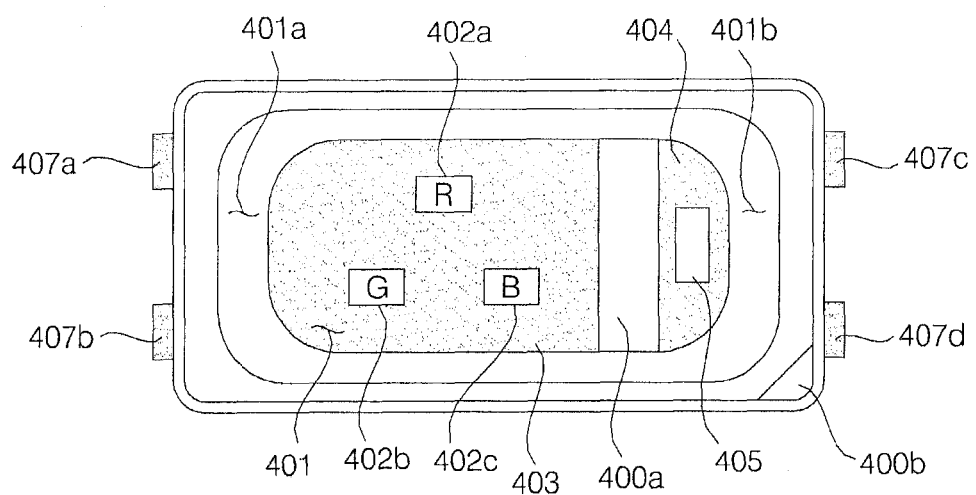
FIG. 9 is a top view of a light emitting device package in accordance with another embodiment as broadly described herein.

FIG. 9 is a top view of a light emitting device package in accordance with another embodiment as broadly described herein. The embodiment shown in FIG. 9 describes a light emitting device package including a plurality of light emitting devices, and the embodiments shown in FIGS. 1 and 8 describe light emitting device packages each including one light emitting device.

The light emitting device package shown in FIG. 9 may include R, G and B light emitting devices 402a, 402b and 402c, a first electrode 403, a second electrode 404, an insulating member 400a, terminals 407a and 407b that protrude from the first electrode 403, terminals 407c and 407d that protrude from the second electrode 404, a cavity 401, a first cavity inclined plane 401a and a second cavity inclined plane 401b that define sides of the cavity 401, a Zener element 405 to prevent ESD and to maintain constant voltage, and a cathode mark 400b to determine polarity.

In this embodiment, individual R, G and B light emitting devices 402a, 402b and 402c are provided, and white light may be emitted by mixing light emitted from the R light emitting device 402a, and light emitted from the G light emitting device 402b and light emitted from the B light emitting device 402c. The R, G and B light emitting devices 402a, 402b and 402c may individually emit red (R), green (G) and blue (B) light, and thus the cavity 401 may be filled with a transparent resin material which does not include a phosphor.

In alternative embodiments, if the light emitting device package shown in FIG. 9 were to include only the R light emitting device 402a and the G light emitting device 402b, the resin material filling the cavity 401 may include a phosphor to excite blue light so as to form white light. Further, if the light emitting device package were to include only the R light emitting device 402a and the B light emitting device 402c, the resin material filling the cavity 401 may include a phosphor to excite green light so as to form white light, and if the light emitting device package were to include only the G light emitting device 402b and the B light emitting device 402c, the resin material filling the cavity 401 may include a phosphor to excite red light so as to form white light.

Two or three light emitting devices may be mounted on the first electrode 403, and the phosphor included in the resin material may be determined according to colors of light emitted from the light emitting devices. In certain embodiments, the R, G and B light emitting devices 402a, 402b and 402c may be arranged in a substantially triangular shape on the first electrode 403, as shown in FIG. 9. Other arrangements of the R, G and B light emitting devices 402a, 402b and 402c may also be appropriate.

FIGS. 10 to 14 are cross-sectional views of various filler materials of light emitting device packages in accordance with embodiments.

Figure 10:
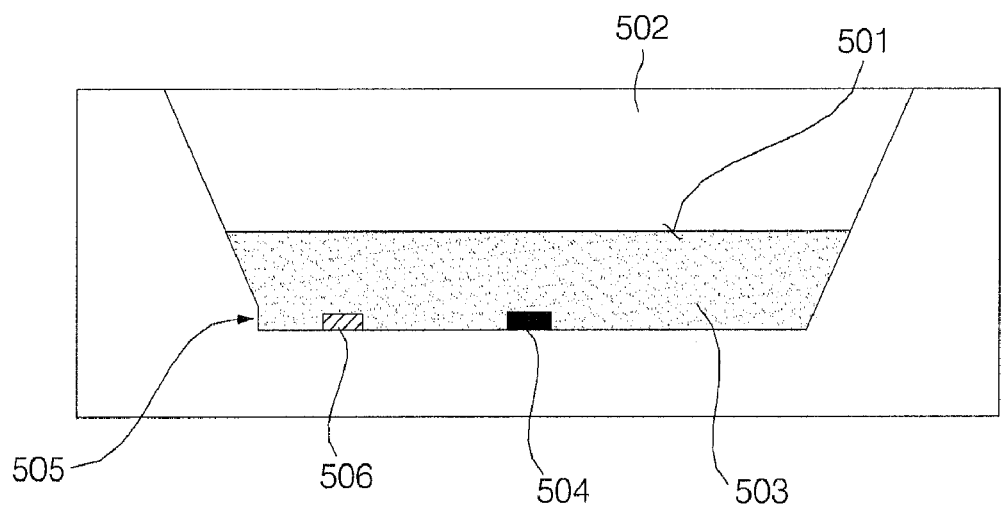
FIGS. 10 to 14 are cross-sectional views of various arrangements of resin materials filling light emitting device packages as embodied and broadly described herein.

As shown in FIG. 10, a first resin material 503 including a phosphor may fill a portion of a cavity 501 in which a light emitting device 504 is mounted, and a second, transparent, resin material 502 may be stacked on the first resin material 503. A Zener element 506 may be positioned so as to be coplanar with the light emitting device 504. An interfacing plane 505 may be formed at the one side of the Zener element 506 and may prevent the Zener element 506 from being inadvertently positioned along an inclined plane of the cavity 501.

Figure 11:
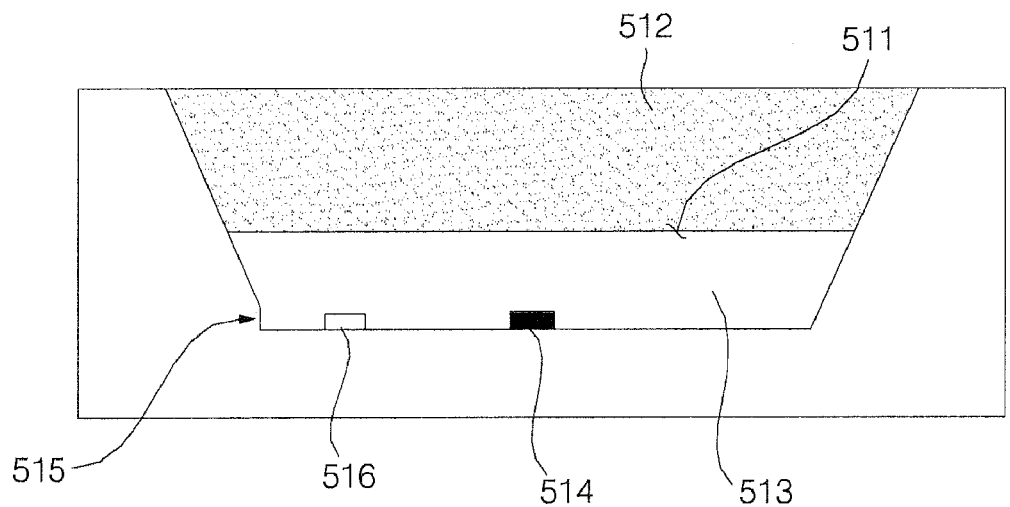

As shown in FIG. 11, a first, transparent, resin material 513 may fill a portion of a cavity 511 in which a light emitting device 514 is mounted, and a second resin material 512 including a phosphor may be stacked on the first resin material 513.

Figure 12:
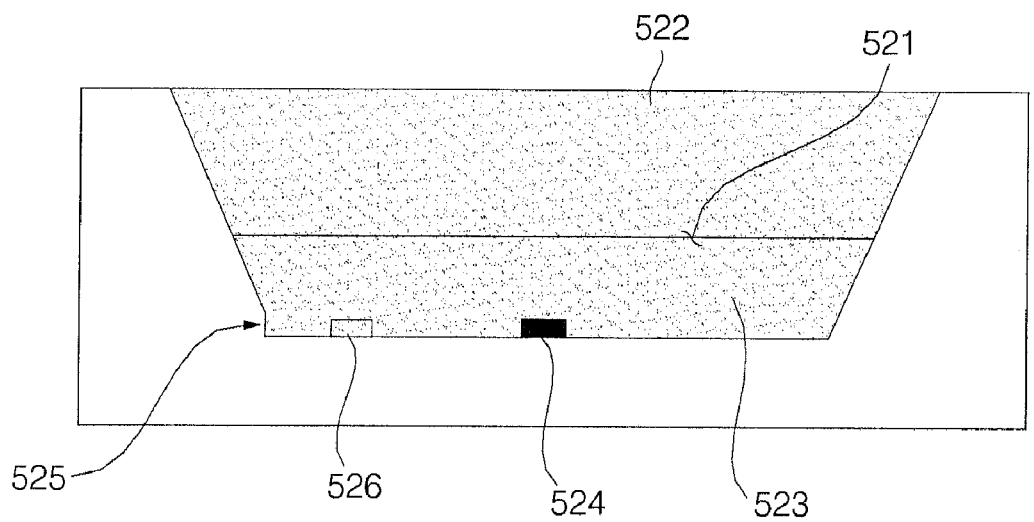

As shown in FIG. 12, a first resin material 523 including a phosphor and a second resin material 522 including the same phosphor as the first resin material 523 may be stacked on the first resin material 523 to fill a cavity 521. Light emitted from a light emitting device 524 may pass through the first resin material 523 contacting the light emitting device 524 and the second resin material 522 stacked on the first resin material 523 and then be discharged to the outside. If, for example, the light emitting device 524 emits blue light, the first resin material 523 and the second resin material 522 may include a yellow phosphor. In certain embodiments, the first resin material 523 and the second resin material 522 may include different concentrations of the phosphor, and the second resin material 522 may be processed into a lens shape so as to convert characteristics of light emitted from the light emitting device 524 to the outside. A Zener element 526 to stabilize voltage applied to the light emitting device 524 and to reduce ESD may be provided at the one side of the light emitting device 524, and an interfacing plane 525 to prevent the Zener element 526 from being inadvertently positioned along an inclined plane of the cavity 521 may be provided.

Figure 13:
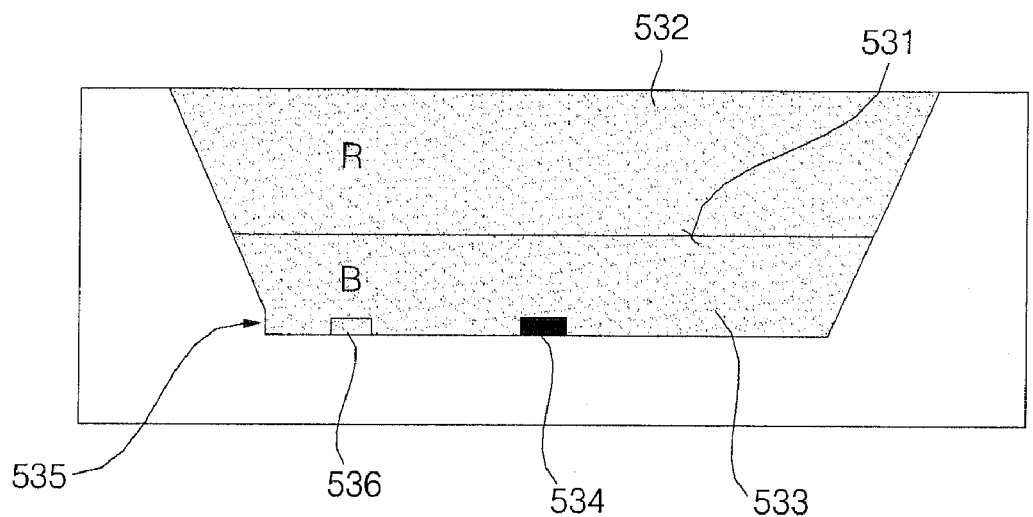

As shown in FIG. 13, a first resin material 533 and a second resin material 532 including two or more phosphors may be sequentially stacked. If a light emitting device 534 is not a blue light emitting device to emit blue light, two or more phosphors may be sequentially stacked within a cavity 531 so as to excite white light.

In FIG. 13, if the light emitting device 534 is, for example, a green light emitting device to emit green light, the first resin material 533 exciting blue light and the second resin material 532 exciting red light may be sequentially stacked on the light emitting device 534 so as to finally excite white light. If, for example, the light emitting device 534 is a red light emitting device to emit red light, the first resin material 533 may include one of a green phosphor or a blue phosphor and the second resin material 532 may include the other of the green phosphor or the blue phosphor.

A Zener element 536 to stabilize voltage applied to the light emitting device 534 and to reduce ESD may be provided at one side of the light emitting device 534, and an interfacing plane 535 to prevent the Zener element 536 from being inadvertently positioned along an inclined plane of the cavity 531 adjacent to the Zener element 536 may be formed on the inclined plane of the cavity 531.

Figure 14:
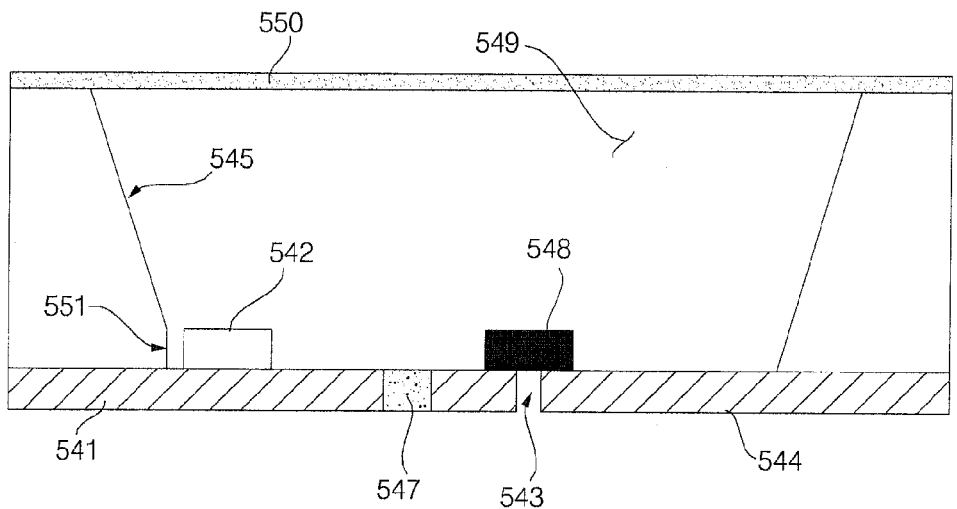

As shown in FIG. 14, a light emitting device package may include a first electrode 544, a second electrode 541, a light emitting device 548 mounted on the first electrode 544, a Zener element 542 mounted on the second electrode 541, and a photo luminescent film (PLF) 550 provided at an upper portion of a cavity 549. In order to prevent the Zener element 542 from moving toward a first cavity inclined plane 545 or from being inadvertently positioned on the first cavity inclined plane 545, an interfacing plane 551 may be formed at a region where the first cavity inclined plane 545 joins the first electrode 541 at an interior corner of the cavity 549.

The first electrode 544 and the second electrode 541 may be separated from each other so as to be electrically insulated from each other, and an insulating member 547 may be formed at a separation region between the first electrode 544 and the second electrode 541 so as to prevent external foreign substances from entering the separation region between the first electrode 544 and the second electrode 541. A heat dissipation hole 543 may be formed under the light emitting device 548, thereby dissipating heat generated by the light emitting device 548.

The PLF 550 may be made of a resin material including a phosphor which is excited by light emitted by the light emitting device 548 to form white light. Other combinations of colors of the light emitting device and the phosphor may also be appropriate.

For example, if the light emitting device 548 is a blue light emitting device to emit blue light, the PLF 550 may include a yellow phosphor that is excited by the blue light emitted by the light emitting device 548 to form white light.

When the PLF 550 is formed on the upper portion of the cavity 549, a separate phosphor may in the cavity 549. When the PLF 550 is formed on the upper portion of the cavity 549, the cavity 549 may be filled with a transparent resin material.

If, for example, light emitted from the light emitting device 548 is red, green or ultraviolet light, the PLF 550 may have a multilayer structure. For example, if the light emitting device 548 is a red light emitting device to emit red light, the PLF 550 may be formed as one film including both a blue phosphor and a green phosphor, or may be formed by stacking plural films respectively exciting blue light and green light.

The above-described light emitting devices may be applied to numerous different types of lighting devices, including, for example, a backlight unit (BLU) or a lighting apparatus.

Figure 15:
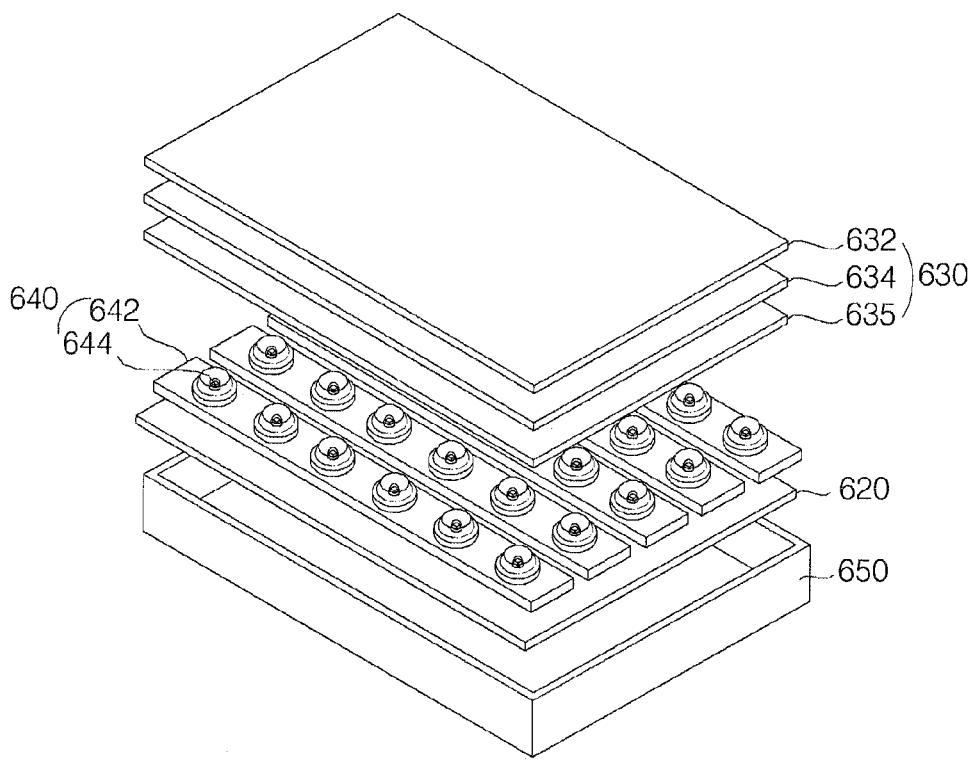
FIG. 15 is a perspective view of a backlight unit including an array of light emitting devices in accordance embodiments as broadly described herein.

FIG. 15 is a perspective view of an exemplary backlight unit including an array of light emitting devices as embodied and broadly described herein. In particular, FIG. 15 illustrates a vertical type backlight unit including a lower receiving member 650, a reflective plate 620, a plurality of light emitting device modules 640, and a plurality of optical sheets 630. Each of the light emitting device modules 640 may include a printed circuit board 642 and an array of a plurality of light emitting device packages 644 mounted on the printed circuit board 642. In certain embodiments, a plurality of protrusions may be formed on the bottom surfaces of the light emitting device packages 644 to improve a mixing effect of red light, green light and blue light if the light emitting device packages 644 emit red, green and blue light so as to form white light. If the light emitting device packages 644 emit only white light, the protrusions on the bottom surfaces of the light emitting device packages 644 may more uniformly disperse the emitted white light.

The reflective plate 620 may have a relatively high light reflectance, thus being capable of reducing optical loss. The optical sheets 630 may include at least one of a brightness enhancing sheet 632, a prism sheet 634 or a diffusion sheet 636.

The diffusion sheet 636 may direct light incident from the light emitting device modules 640 toward the front surface of a liquid crystal display panel, and may diffuse the light so as to achieve uniform distribution over a wide area and then to irradiate the light onto the liquid crystal display panel.

The prism sheet 634 may convert inclined light (from the incident light) into vertical light so as to emit the vertical light. That is, in order to convert inclined light into vertical light, at least one prism sheet 634 may be positioned under the liquid crystal display panel.

The brightness enhancing sheet 632 may transmit light which is parallel with a transmission axis thereof, and reflect light which is perpendicular to the transmission axis thereof.

When a light emitting device package as embodied and broadly described herein is applied to such a backlight unit, durability and reliability of the backlight unit may be improved and damage to Zener elements of the respective light emitting device packages of the backlight unit may be reduced, thus allowing the backlight unit to properly cope with external ESD.

Figure 16:
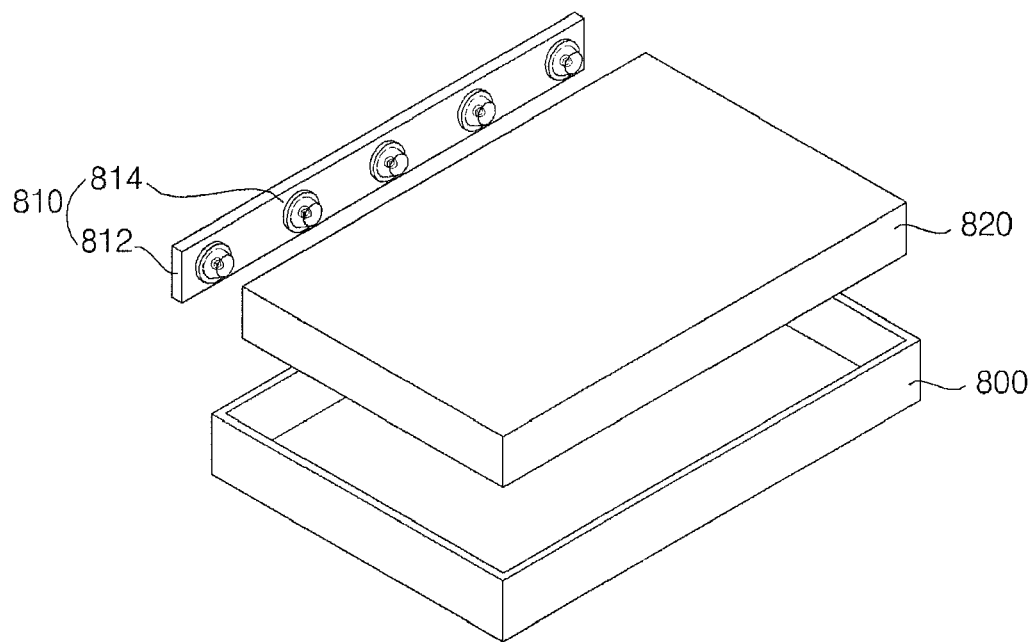
FIG. 16 is a perspective view of another backlight unit including an array of light emitting devices in accordance with embodiments as broadly described herein.

FIG. 16 is a perspective view of another exemplary backlight unit including light emitting devices as embodied and broadly described herein.

In particular, FIG. 16 illustrates an edge type backlight unit including a lower receiving member 800, a light emitting device module 810 to output light, a light guide plate 820 positioned adjacent to the light emitting device module 810, and a plurality of optical sheets. The plurality of optical sheets may be located on an upper surface of the light guide plate 820. The plurality of optical sheets may be the same as the plurality of optical sheets 630 described with respect to FIG. 15 and thus a detailed description thereof will be omitted.

The light emitting device module 810 may include a printed circuit board 812 and an array of a plurality of light emitting device packages 814 mounted on the printed circuit board 812. A metal core PCB (MCPCB) or a PCB made of FR4 may be used as the printed circuit board 812. Other types of PCB may be used as the printed circuit board 812. Further, the printed circuit board 812 may have various shapes, in addition to a rectangular shape, according to the structure of a particular backlight assembly.

The light guide plate 820 may convert light emitted from the light emitting device packages 814 into surface light and then supply the surface light to a liquid crystal display panel. The plurality of optical sheets may provide for a uniform brightness distribution of light supplied from the light guide plate 820 and may improve a vertical incident property. A reflective sheet to reflect light emitted from the rear portion of the light guide plate 820 back to the light guide plate 820 may be located on the rear surface of the light guide plate 820.

The structure of the vertical type backlight unit described above and shown in FIG. 15 and the structure of the edge type backlight unit described above and shown in FIG. 16 may be combined.

Figure 17:
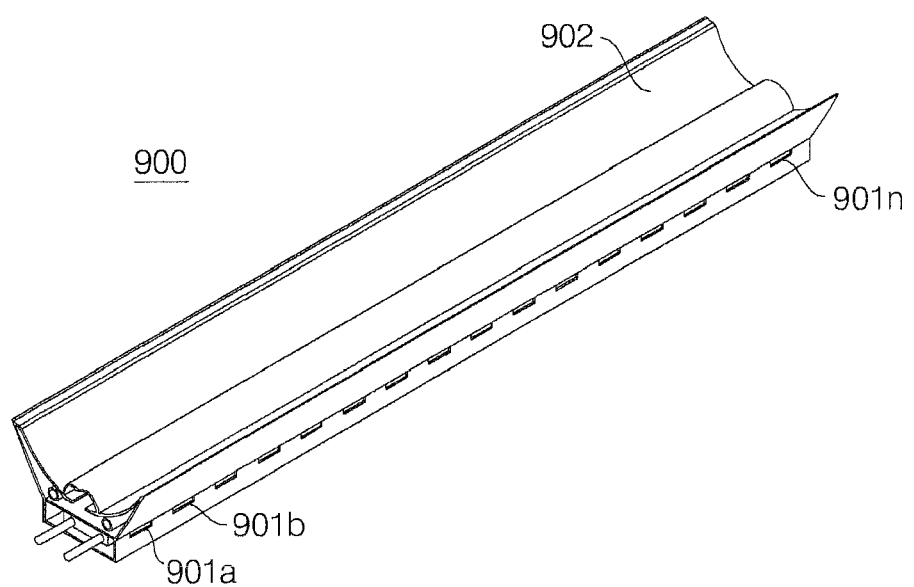
FIG. 17 is a perspective view of an exemplary lighting apparatus including light emitting devices as embodied and broadly described herein.

FIG. 17 is a perspective view of an exemplary lighting apparatus including light emitting devices as embodied and broadly described herein.

With reference to FIG. 17, a lighting apparatus 900 may include a shade 902 and light emitting device packages 901a~901n arranged on one side surface of the shade 902. A power supply device to supply power to the respective light emitting device packages 901a~901n may also be provided.

A light emitting device package in accordance with embodiments as broadly described herein may cause an ESD element, such as a Zener element, to absorb no light, thus expecting outputting a higher quantity of light.

FIG. 17 illustrates a fluorescent type lamp shade. However, a light emitting device as embodied and broadly described herein may also be applied to an incandescent lamp, a fluorescent parallel lamp (FPL), a fluorescent lamp, a halogen lamp, a metal lamp and other various lamp types and socket standards.

A lighting system as embodied and broadly described herein may include the backlight units and the lighting apparatus shown in FIGS. 15 to 17 and an apparatus using the light emitting device package in accordance with embodiments as broadly described herein for the purpose of illumination.

A light emitting device package as embodied and broadly described herein may allow a Zener element for ESD prevention from being mounted along an interfacing plane of a cavity inclined plane in a body, thereby preventing damage to the Zener element.

A light emitting device package as embodied and broadly described herein may allow the interfacing plane of the cavity inclined plane to have an inclination angle, thereby reflecting side light emitted from a light emitting device and thus improving light efficiency.

A light emitting device package may be provided which may prevent a Zener element mounted on an electrode from being inadvertently positioned along an inclined plane of a cavity.

A light emitting device package according to an exemplary embodiment as broadly described herein may include a light emitting device and a Zener element, a first electrode on which the light emitting device is mounted and a second electrode on which the Zener element is mounted, and a body provided with cavity inclined planes to form a cavity on the first and second electrodes, wherein the cavity inclined planes include a first cavity inclined plane adjacent to the Zener element, and the first cavity inclined plane includes an inclined plane having a first inclination angle with respect to the surface of the second electrode and an interfacing plane having a second inclination angle differing from the first inclination angle with respect to the surface of the second electrode and formed between the inclined plane and the second electrode.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package, comprising:
 a substrate;
 a light emitting device and a passive current regulator provided on the substrate, the light emitting device comprising at least one light emitting diode (LED); and
 at least one inclined wall provided on the substrate, wherein the at least one inclined wall comprises:
  a first inclined wall positioned adjacent to the passive current regulator, the first inclined wall including:
   a first inclined surface forming a first inclination angle with respect to a surface of the substrate; and
   a second inclined surface forming a second inclination angle with respect to the surface of the substrate, wherein the second inclination angle is different than the first inclination angle, and the second inclined surface is formed between the first inclined surface and the substrate, and
  a second inclined wall positioned adjacent to the light emitting device, the second inclined wall comprising a third inclined surface forming the first inclination angle with respect to the surface of the substrate.

2. The light emitting device package of claim 1, wherein the first inclination angle is between 120° and 170°.

3. The light emitting device package of claim 1, wherein the second inclination angle is approximately 90°.

4. The light emitting device package of claim 1, wherein the second inclination angle is greater than 90° and less than the first inclination angle.

5. The light emitting device package of claim 1, wherein a height of the second inclined surface is less than a height of the passive current regulator or greater than the height of the passive current regulator.

6. The light emitting device package of claim 1, wherein a height of the passive current regulator is between approximately 50 μm and 300 μm.

7. The light emitting device package of claim 1, wherein the at least one inclined wall further comprises a second inclined wall that defines a cavity together with the first inclined wall and the substrate, and wherein the light emitting device package further comprises at least one resin material filling the cavity.

8. The light emitting device package of claim 7, wherein the at least one resin material includes at least one of a red (R) phosphor, a green (G) phosphor, a blue (B) phosphor or a yellow (Y) phosphor.

9. The light emitting device package of claim 7, wherein the at least one resin material includes a first resin material and a second resin material, and wherein one of the first resin material or the second resin material includes at least one of a red (R) phosphor, a green (G) phosphor, a blue (B) phosphor or a yellow (Y) phosphor.

10. The light emitting device package of claim 1, wherein the second inclined wall is nonsymmetrical with the first inclined wall.

11. The light emitting device package of claim 10, wherein the second inclined wall further comprises a fourth inclined surface forming a third inclination angle with respect to the surface of the substrate, wherein the third inclination angle is different from the first inclination angle, and wherein the fourth inclined surface is formed between the third inclined plane and the substrate.

12. The light emitting device package of claim 11, wherein the third inclination angle is different from the second inclination angle.

13. The light emitting device package of claim 11, wherein the third inclination angle is greater than the second inclination angle and less than the first inclination angle.

14. The light emitting device package of claim 11, wherein the first inclined wall further comprises:
   an upper inclined surface forming a fourth inclination angle with the substrate; and
   a first step surface that extends between the first inclined surface and the upper inclined surface, wherein the upper inclined surface extends upward from an outermost end of the first step surface toward a top of the light emitting device package, and the first inclined surface extends downward from an innermost end of the first step surface to the first inclined surface.

15. The light emitting device package of claim 14, wherein the second inclined wall further comprises:
   a second step surface that extends between the third inclined surface and the fourth inclined surface, wherein the third inclined surface extends upward from an outermost end of the second step surface toward the top of the light emitting device package, and the fourth inclined surface extends downward from an innermost end of the second step surface to the substrate.

16. The light emitting device package of claim 1, wherein the substrate comprises a first electrode and a second electrode positioned side by side with a space formed therebetween, and an insulator provided in the space such that the first and second electrode and the insulator form a coplanar surface, and wherein the light emitting device is installed on the first electrode and the passive current regulator is a Zener diode installed on the second electrode.

17. The light emitting device package of claim 1, wherein the first inclined wall further comprises:
   an upper inclined surface forming a fourth inclination angle with the substrate; and
   a step surface that extends between the first inclined surface and the upper inclined surface, wherein the step surface is oriented substantially parallel to the substrate.

18. The light emitting device package of claim 17, wherein the upper inclined surface extends upward from an outermost end of the step surface toward a top of the light emitting device package, and the first inclined surface extends downward from an innermost end of the step surface to the second inclined surface.

19. A lighting system, comprising:
   a plurality of light emitting device packages, each comprising:
      a light emitting device mounted on a first electrode, the light emitting device comprising at least one light emitting diode (LED);
      a Zener element mounted on a second electrode; and
      a body having a cavity formed therein defined by inclined planes and the first and second electrodes; and
   a printed circuit board on which the plurality of light emitting device packages are mounted, wherein the inclined planes of each of the plurality of light emitting device packages comprises:
      a first inclined plane positioned adjacent to the Zener element, the first inclined plane including:
         a first plane oriented at a first inclination angle with respect to a surface of the second electrode; and
         a second plane formed between the first plane and the second electrode, the second plane being oriented at a second inclination angle with respect to the surface of the second electrode, wherein the first inclination angle is different from the second inclination angle; and
      a second inclined plane positioned adjacent to the light emitting device, the second inclined plane including a third inclined surface forming the first inclination angle with respect to the surface of the substrate.

* * * * *